(12) United States Patent
He et al.

(10) Patent No.: US 8,969,189 B2
(45) Date of Patent: Mar. 3, 2015

(54) CONTACT STRUCTURE EMPLOYING A SELF-ALIGNED GATE CAP

(71) Applicant: International Business Machines Corporation, Armonk, NY (US)

(72) Inventors: Hong He, Schenectady, NY (US); Chiahsun Tseng, Wynantskill, NY (US); Chun-chen Yeh, Clifton Park, NJ (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 14/027,315

(22) Filed: Sep. 16, 2013

(65) Prior Publication Data
US 2014/0315379 A1    Oct. 23, 2014

Related U.S. Application Data

(63) Continuation of application No. 13/865,512, filed on Apr. 18, 2013.

(51) Int. Cl.
*H01L 21/3205* (2006.01)
*H01L 21/4763* (2006.01)
*H01L 21/28* (2006.01)

(52) U.S. Cl.
CPC .............................. *H01L 21/28132* (2013.01)
USPC ........... 438/595; 438/652; 438/655; 257/288; 257/408

(58) Field of Classification Search
CPC ................. H01L 21/76829; H01L 21/76897; H01L 21/823437; H01L 21/84; H01L 27/1203; H01L 29/42384
USPC .......... 257/410, 412, 750, 751; 438/592, 595, 438/652, 655
See application file for complete search history.

(56) References Cited

U.S. PATENT DOCUMENTS 5,902,130 A * 5/1999 Passlack et al. ............... 438/604
7,126,198 B2 * 10/2006 Steiner et al. ................. 257/412
(Continued)

OTHER PUBLICATIONS

Nguyen, "High-density plasma chemical vapor deposition of silicon-based dielectric films for integrated circuits" IBM Journal of Research and Development (Jan. 1999) pp. 109-126, vol. 43, No. 1-2.
(Continued)

*Primary Examiner* — Zandra Smith
*Assistant Examiner* — John M Parker
(74) *Attorney, Agent, or Firm* — Scully, Scott, Murphy & Presser, P.C.; Vazken Alexanian

(57) ABSTRACT

After formation of a replacement gate structure, a template dielectric layer employed to pattern the replacement gate structure is removed. After deposition of a dielectric liner, a first dielectric material layer is deposited by an anisotropic deposition and an isotropic etchback. A second dielectric material layer is deposited and planarized employing the first dielectric material portion as a stopping structure. The first dielectric material portion is removed selective to the second dielectric material layer, and is replaced with gate cap dielectric material portion including at least one dielectric material different from the materials of the dielectric material layers. A contact via hole extending to a source/drain region is formed employing the gate cap dielectric material portion as an etch stop structure. A contact via structure is spaced from the replacement gate structure at least by remaining portions of the gate cap dielectric material portion.

18 Claims, 15 Drawing Sheets

(56) References Cited

U.S. PATENT DOCUMENTS

| | | |
|---|---|---|
| 7,659,171 B2 * | 2/2010 | Furukawa et al. ............ 438/299 |
| 7,709,380 B2 | 5/2010 | Veloso |
| 7,923,321 B2 | 4/2011 | Lai et al. |
| 7,977,181 B2 | 7/2011 | Lai et al. |
| 7,981,801 B2 | 7/2011 | Chuang et al. |
| 2007/0090395 A1 * | 4/2007 | Sebe et al. ................... 257/144 |
| 2009/0057730 A1 * | 3/2009 | Furukawa et al. ............ 257/288 |
| 2011/0057267 A1 | 3/2011 | Chuang et al. |
| 2011/0298061 A1 | 12/2011 | Siddiqui et al. |
| 2012/0211844 A1 | 8/2012 | Schloesser et al. |
| 2012/0223394 A1 | 9/2012 | Toh et al. |
| 2013/0175619 A1 * | 7/2013 | Fan et al. ..................... 257/347 |
| 2013/0181265 A1 * | 7/2013 | Grasshoff et al. ............. 257/288 |

OTHER PUBLICATIONS

Frank, "High-k/metal gate innovations enabling continued CMOS scaling" Proceedings of the ESSCIRC (Sep. 12-16, 2011) pp. 50-58.

* cited by examiner

CONTACT STRUCTURE EMPLOYING A SELF-ALIGNED GATE CAP

CROSS REFERENCE TO RELATED APPLICATION

This application is a continuation of U.S. patent application Ser. No. 13/865,512, filed Apr. 18, 2013 the entire content and disclosure of which is incorporated herein by reference.

BACKGROUND

The present invention generally relates to semiconductor devices, and particularly to semiconductor structures having a self-aligned gate cap for preventing electrical shorts from a contact structure, and methods of manufacturing the same.

Formation of electrical contacts to source/drain regions in a replacement gate field effect transistor is challenging because of the physical proximity in the areas of the source/drain regions and the areas of the replacement gate structures. An integration scheme is desired that allows formation of contact structures that are not prone to electrical shorts to replacement gate structures.

SUMMARY

After formation of a replacement gate structure, a template dielectric layer employed to pattern the replacement gate structure is removed. After deposition of a dielectric liner, a first dielectric material layer is deposited by an anisotropic deposition method, and is isotropically etched to form a first dielectric material portion overlying the replacement gate structure. A second dielectric material layer is deposited and planarized employing the first dielectric material portion as a stopping structure. The first dielectric material portion is removed selective to the second dielectric material layer, and is replaced with gate cap dielectric material portion including at least one dielectric material different from the materials of the dielectric material layers. A contact via hole extending to a source/drain region is formed employing the gate cap dielectric material portion as an etch stop structure. A contact via structure is spaced from the replacement gate structure at least by remaining portions of the gate cap dielectric material portion.

According to an aspect of the present invention, a semiconductor structure is provided. The semiconductor structure includes a gate structure containing a stack of a gate dielectric and a gate electrode and overlying a portion of a semiconductor material layer. The semiconductor structure further includes a first dielectric material layer containing a first dielectric material and overlying the semiconductor material layer. The semiconductor structure further includes a second dielectric material layer containing a second dielectric material that is different from the first dielectric material and overlying the first dielectric material layer and including a planar top surface. The semiconductor structure further includes a gate cap dielectric material portion containing at least a third dielectric material that is different from the dielectric materials and overlying the gate structure and contacting sidewalls of the first dielectric material layer. The semiconductor structure further includes a contact via structure extending through the dielectric material layers, providing electrical contact to an element in the semiconductor material layer, and contacting at least a sidewall of the gate cap dielectric material portion.

According to another aspect of the present invention, a method of forming a semiconductor structure is provided. A gate structure is formed, which includes a stack of a gate dielectric and a gate electrode and over a portion of a semiconductor material layer. A first dielectric material layer including a first dielectric material is formed over the semiconductor material layer and the gate structure. A second dielectric material layer is formed over the first dielectric material layer. The second dielectric material layer includes a second dielectric material that is different from the first dielectric material. The second dielectric material layer is planarized to provide a planar top surface. A top surface of the first dielectric material layer is physically exposed over the gate structure. A portion of the first dielectric material layer is removed from above the gate structure by an anisotropic etch employing the second dielectric material layer as an etch mask. A cavity is formed over the gate structure. A gate cap dielectric material portion is formed by filling the cavity with at least a third dielectric material that is different from the dielectric materials, the third dielectric material contacting sidewalls of the first dielectric material layer.

DETAILED DESCRIPTION

Figure 1:
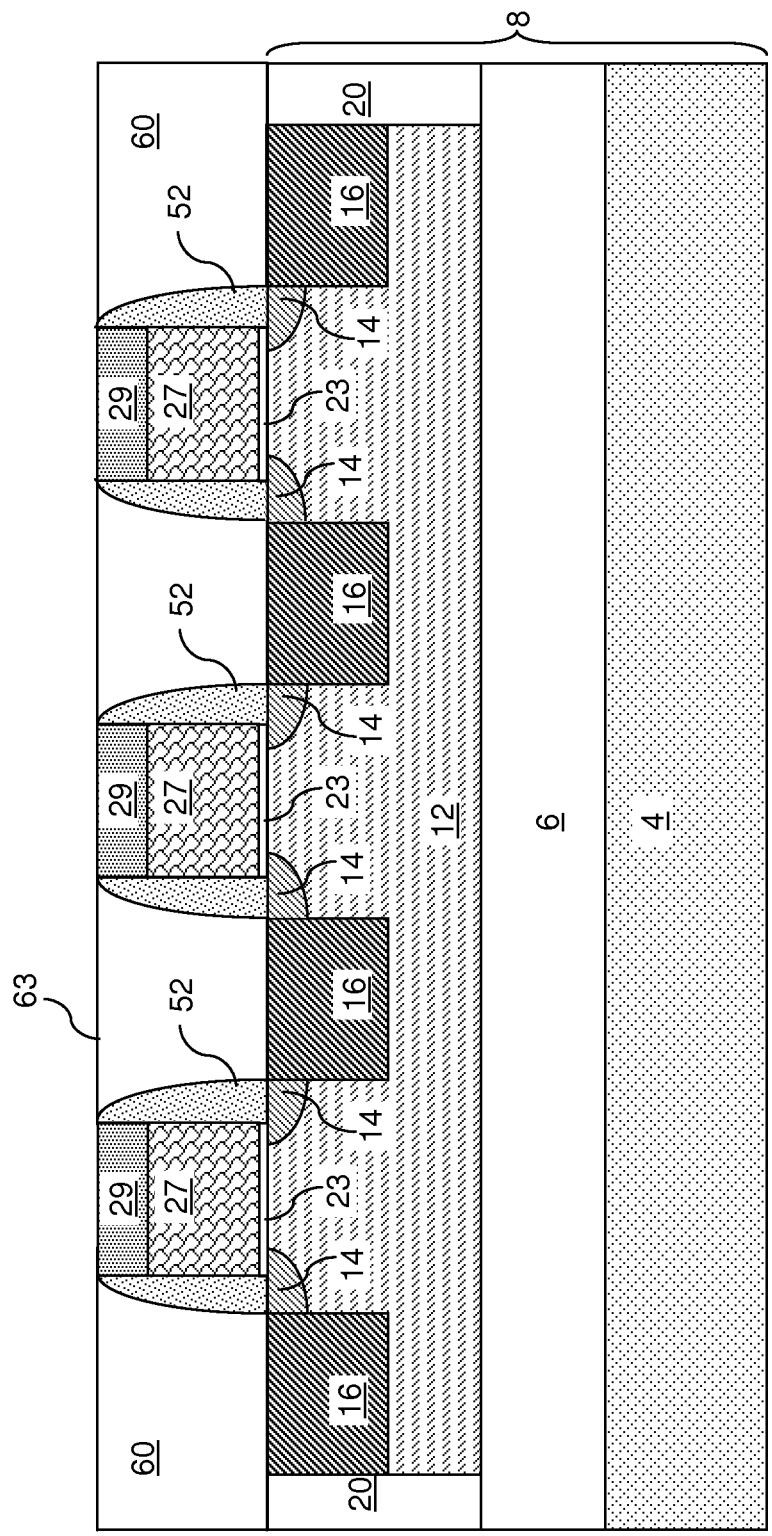
FIG. 1 is vertical cross-sectional view of a first exemplary semiconductor structure after formation of disposable gate structures and formation of a planar dielectric surface on a template dielectric layer according to an embodiment of the present invention.

As stated above, the present invention relates to semiconductor structures having a self-aligned gate cap for preventing electrical shorts from a contact structure, and methods of manufacturing the same. Aspects of the present invention are now described in detail with accompanying figures. Like and corresponding elements mentioned herein and illustrated in the drawings are referred to by like reference numerals. The drawings are not necessarily drawn to scale. As used herein, ordinals such as "first" and "second" are employed merely to distinguish similar elements, and different ordinals may be employed to designate a same element in the specification and/or claims.

Referring to FIG. 1, a first exemplary semiconductor structure according to an embodiment of the present invention includes a semiconductor substrate 8, on which various components of field effect transistors are formed. The semiconductor substrate 8 can be a bulk substrate including a bulk semiconductor material throughout, or a semiconductor-on-insulator (SOI) substrate containing a top semiconductor layer, a buried insulator layer 6 located under the top semiconductor layer, and a handle substrate layer 4 located under the buried insulator layer 5.

Various portions of the semiconductor material in the semiconductor substrate 8 can be doped with electrical dopants of n-type or p-type at different dopant concentration levels. For example, the top semiconductor layer may include a semiconductor material layer 12. Various doped wells (not shown) may be formed in the semiconductor material layer 12, for example, by ion implantation. Each of the doped well can be independently doped with n-type electrical dopants or p-type electrical dopants. The semiconductor material layer 12 can include a single crystalline semiconductor material such as single crystalline silicon, a single crystalline silicon germanium alloy, or any other single crystalline semiconductor material known in the art.

Shallow trench isolation structures 20 can be formed in the top semiconductor layer to provide electrical isolation to portions of the semiconductor material layer 12 from neighboring portions of the semiconductor material layer 12. If the semiconductor substrate 8 is a semiconductor-on-insulator substrate, bottom surfaces of the semiconductor material layer 12 may contact the buried insulator layer 6, which electrically isolates the semiconductor material layer 12 from the handle substrate layer 4. Topmost surfaces of the shallow trench isolation structures 20 can be substantially coplanar with, raised above, or recessed below, topmost surfaces of the semiconductor material layer 12.

Disposable gate level layers can be deposited on the semiconductor substrate 8 as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a template dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a template dielectric layer to be subsequently formed.

The disposable gate level layers are lithographically patterned to form disposable gate structures. Specifically, a photoresist (not shown) is applied over the topmost surface of the disposable gate level layers and is lithographically patterned by lithographic exposure and development. The pattern in the photoresist is transferred into the disposable gate level layers by an etch, which can be an anisotropic etch such as a reactive ion etch. The remaining portions of the disposable gate level layers after the pattern transfer constitute disposable gate structures.

Each disposable gate structure can be a stack of a disposable gate dielectric portion 23, a disposable gate material portion 27, and a disposable gate cap portion 29. Each disposable gate cap portion 29 is a remaining portion of the disposable gate cap dielectric layer. Each disposable gate material portion 27 is a remaining portion of the disposable gate material layer. Each disposable gate dielectric portion 23 is a remaining portion of the disposable gate dielectric layer.

Ion implantations can be employed to form various source/drain extension regions 14. As used herein, "source/drain extension regions" collectively refer to source extension regions and drain extension regions. Gate spacers 52 can be formed on sidewalls of each of the disposable gate structures, for example, by deposition of a conformal dielectric material layer and an anisotropic etch. Subsequently, ion implantations can be employed to form various source/drain regions 16. As used herein, "source/drain regions" collectively refer to source regions and drain regions. A p-n junction can be formed between each of the source/drain regions 16 and the semiconductor material layer 12.

A template dielectric layer 60 can be deposited over the semiconductor substrate 8, the disposable gate structures (29, 27, 23) and the gate spacers 52. Preferably, the template dielectric layer 60 includes a dielectric material that can be planarized, for example, by chemical mechanical planarization. For example, the template dielectric layer 60 can include a doped silicate glass, an undoped silicate glass (silicon oxide), and/or porous or non-porous organosilicate glass. The template dielectric layer 60 can include a single dielectric material, or can include a stack of multiple dielectric materials. For example, the template dielectric layer 60 can include a stack, from bottom to top, of a spin-on glass (SOG) material including a flowable silicon oxide material and another silicon oxide material formed by high density plasma deposition.

The template dielectric layer 60 can be planarized above the topmost surfaces of the disposable gate structures (29, 27, 23). The planarization can be performed, for example, by chemical mechanical planarization (CMP). The planar topmost surface of the template dielectric layer 60 is herein referred to as a planar dielectric surface 63.

Figure 2:
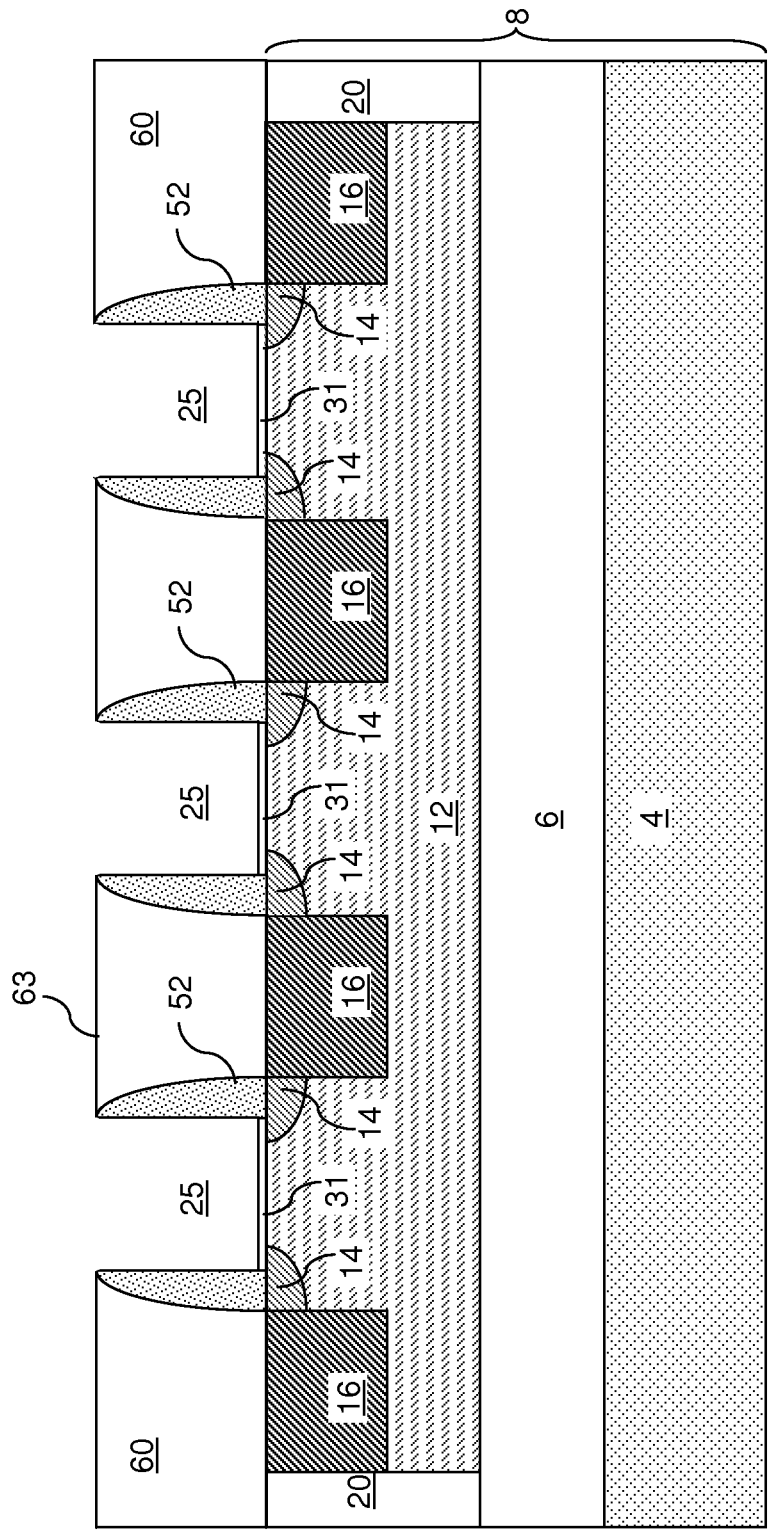
FIG. 2 is a vertical cross-sectional view of the first exemplary semiconductor structure after removal of the disposable gate structures according to an embodiment of the present invention.

Referring to FIG. 2, the disposable gate structures (29, 27, 23) can be removed by at least one etch. The at least one etch can be a recess etch, which can be an isotropic etch or anisotropic etch. The removal of the disposable gate structures (29, 2A, 23) can be performed employing an etch chemistry that is selective to the gate spacers 52 and to the dielectric materials of the template dielectric layer 60. Gate cavities 25 may be formed in volumes from which the disposable gate structures (29, 27, 23) are removed, respectively. The semiconductor surfaces of the semiconductor material layer 12 are physically exposed at the bottom of each gate cavity 25. Each gate cavity 25 is laterally enclosed by a gate spacer 52.

Optionally, an interfacial dielectric layer 31 can be formed on each exposed surface of the semiconductor material layer 12 by conversion of the exposed semiconductor material into a dielectric material. Each interfacial dielectric layer 31 can be a semiconductor-element-containing dielectric layer. The formation of the interfacial dielectric layers 31 can be effected by thermal conversion or plasma treatment. If the semiconductor material of the semiconductor material layer 12 includes silicon, the interfacial dielectric layers 31 can include silicon oxide or silicon nitride.

Figure 3:
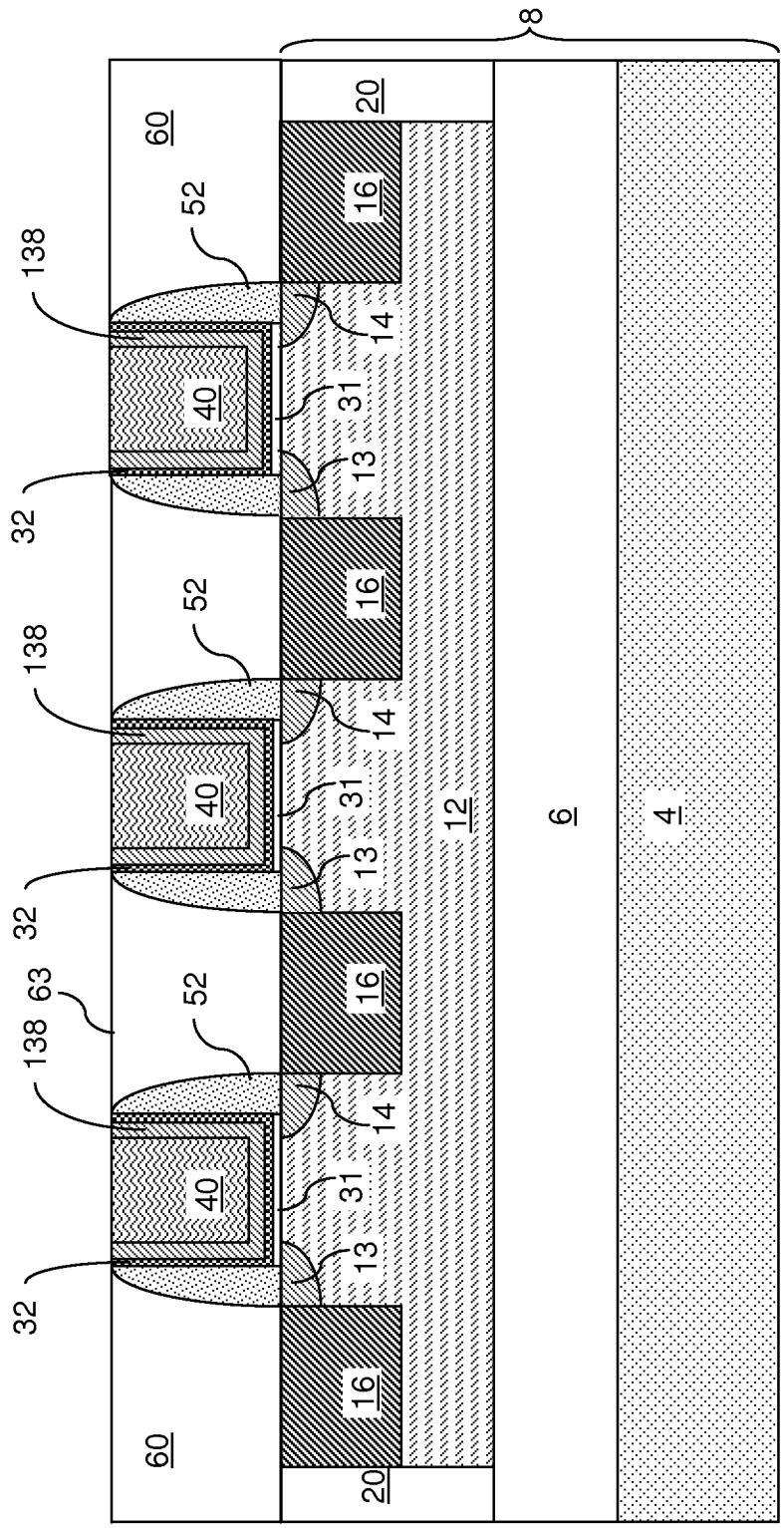
FIG. 3 is a vertical cross-sectional view of the first exemplary semiconductor structure after formation of replacement gate structures according to an embodiment of the present invention.

Referring to FIG. 3, replacement gate structures can be formed in the gate cavities 25. As used herein, a "replacement gate structure" is a structure formed by replacement of a disposable structure overlying a channel of a field effect transistor with a permanent gate structure. Specifically, a gate dielectric and a gate electrode are formed within each of the gate cavities 25.

For example, a gate dielectric layer can be deposited on the bottom surface and sidewall surfaces of each gate cavity 25A and over the template dielectric layer 60. In one embodiment, the gate dielectric layer can be deposited as a contiguous gate dielectric layer that contiguously covers all top surfaces of the template dielectric layer 60, all inner sidewall surfaces of the gate spacers 52, and all top surfaces of the interfacial dielectric layers 31. The gate dielectric layer can be a high dielectric constant (high-k) material layer having a dielectric constant greater than 3.9. The gate dielectric layer can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer, as measured at horizontal portions, can be from 0.9 nm to 6 nm, and from 1.0 nm to 3 nm. The gate dielectric layer may have an effective oxide thickness on the order of or less than 2 nm. In one embodiment, the gate dielectric layer is a hafnium oxide ($HfO_2$) layer.

Subsequently, a work function material layer can be deposited. The work function material layer includes a metallic material that can adjust the work function of the gate electrodes to be formed. The material of the work function material layer can be selected from any work function material known in the art. The material of the work function material layer can be selected to optimize the performance of field effect transistors to be subsequently formed. In one embodiment, the replacement gate structures can includes gate electrodes having different compositions.

A conductive material layer can be deposited on the work function material layer. The conductive material layer can include a conductive material deposited by physical vapor deposition, chemical vapor deposition, and/or electroplating. For example, the conductive material layer can be an aluminum layer, a tungsten layer, an aluminum alloy layer, or a tungsten alloy layer, and can be deposited by physical vapor deposition. The thickness of the conductive material layer, as measured in a planar region of the conductive material layer above the top surface of the template dielectric layer 60, can be from 30 nm to 500 nm, although lesser and greater thicknesses can also be employed.

Portions of the gate conductor layer, the work function material layer, and the gate dielectric layer can be removed from above the planar dielectric surface 63 of the template dielectric layer 60 by a planarization process. Replacement gate structures are thus formed, each of which includes a stack of an interfacial dielectric layer 31 and various remaining portions of the gate conductor layer, the work function material layer, and the gate dielectric layer. Each replacement gate structure overlies a channel region of a field effect transistor. The first replacement gate structure and the second replacement gate structure are formed concurrently.

Each replacement gate structure (31, 32, 138, 40), which is a gate structure formed by a replacement gate integration scheme, can include an interfacial dielectric layer 31, a gate dielectric 32 which is a remaining portion of the gate dielectric layer, a work function material portion 138 which is a remaining portion of the work function material layer, and a gate conductor portion 40 which is a remaining portion of the gate conductor layer. The work function material portion 138 and the gate conductor portion 40 collectively constitute a gate electrode (138, 40).

The top surfaces of the gate electrodes (138, 40) can be coplanar with the top planar top surface of the template dielectric layer 60. Each gate dielectric 32 can be a U-shaped gate dielectric including a horizontal portion that underlies a gate electrode (138, 40) and a vertical portion that laterally surrounds the gate electrode (138, 40). The outer sidewalls of each gate dielectric 32 can be in contact with an inner vertical sidewall of a gate spacer 52. Each gate spacer 52 laterally surrounds a replacement gate structure (31, 32, 138, 40).

Figure 4:
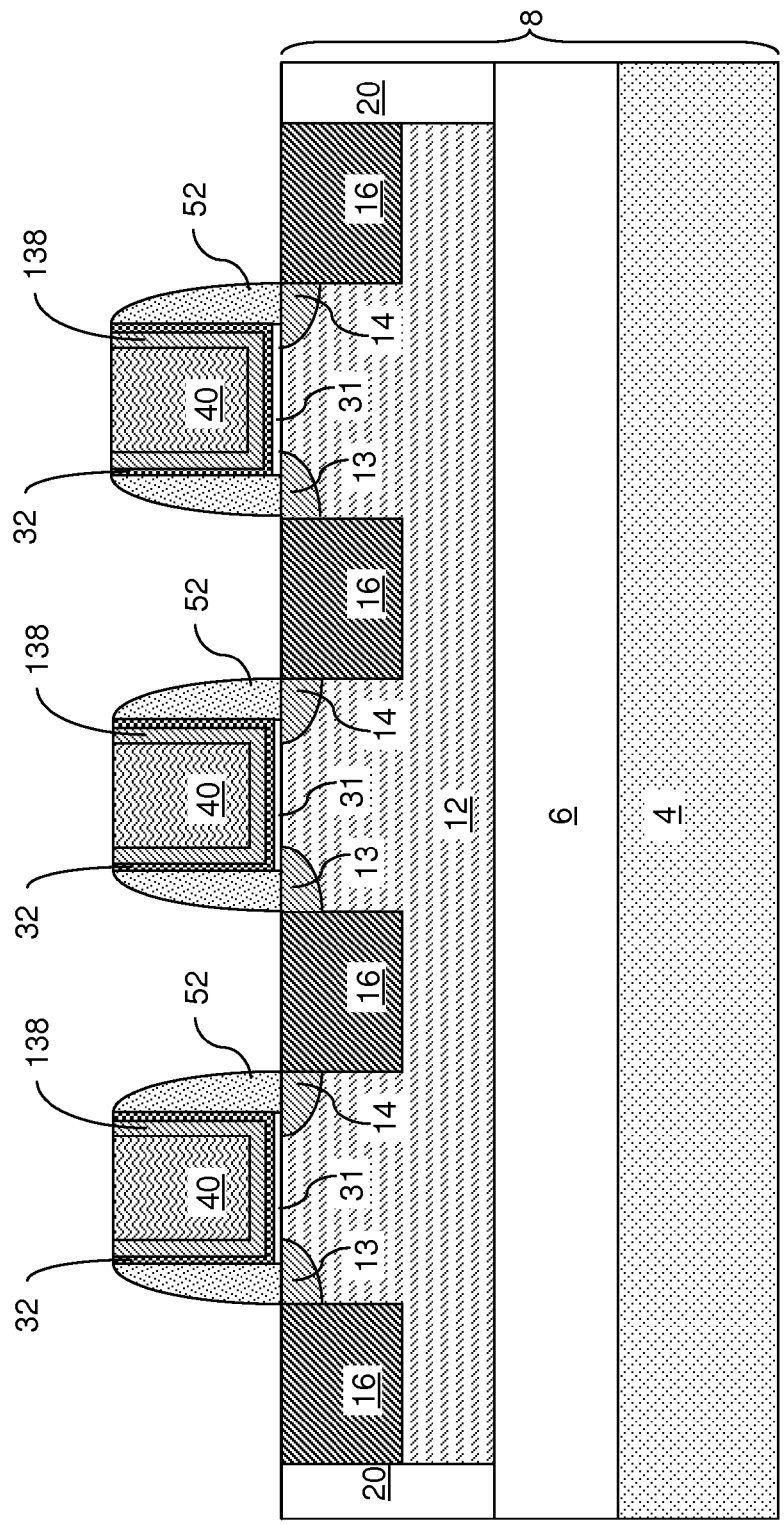
FIG. 4 is a vertical cross-sectional view of the first exemplary semiconductor structure after removal of the template dielectric layer according to an embodiment of the present invention.

Referring to FIG. 4, the template dielectric layer 60 can be removed selective to the replacement gate structures (31, 32, 138, 40), the gate spacers 52, and the semiconductor material of the source/drain regions 16. The template dielectric layer 60 can be removed by a wet etch or a dry etch. For example, if the template dielectric layer 60 includes silicon oxide or organosilicate glass and the gate spacers 52 include silicon nitride, the removal of the template dielectric layer 60 can be performed by a wet etch employing hydrofluoric acid. If the template dielectric layer 60 includes organosilicate glass and the gate spacers 52 include silicon oxide, the removal of the template dielectric layer 60 can be performed employing dilute hydrofluoric acid.

Figure 5:
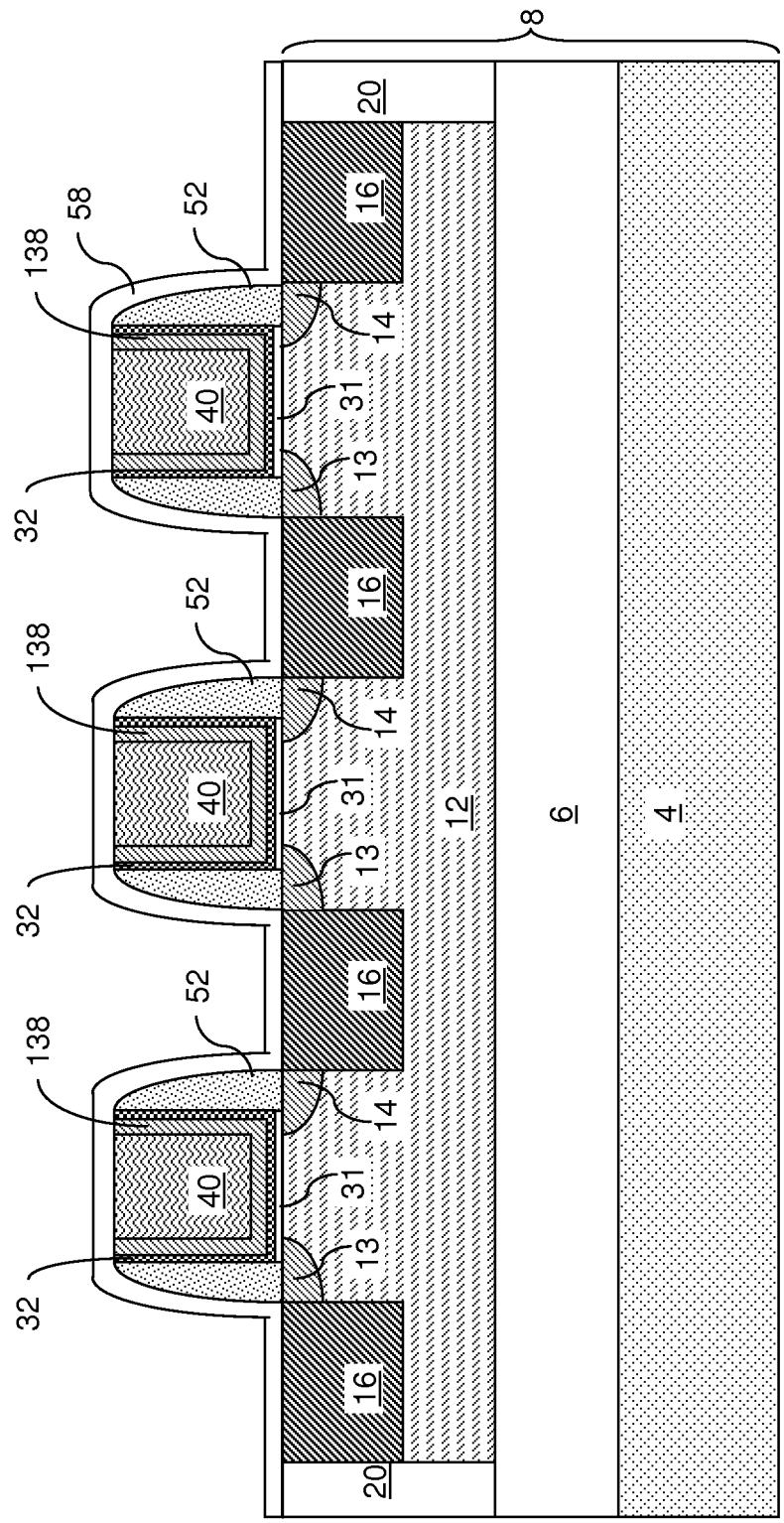
FIG. 5 is a vertical cross-sectional view of the first exemplary semiconductor structure after formation of a dielectric liner according to an embodiment of the present invention.

Referring to FIG. 5, a dielectric liner 58 can be optionally deposited over the semiconductor material layer 12 and the replacement gate structures (31, 32, 138, 40). The dielectric liner 58 includes a dielectric material such as a dielectric metal oxide having a dielectric constant greater than 3.9, or can include silicon nitride. The dielectric liner 58 laterally surround the gate structures (31, 32, 138, 40), and can be deposited directly on the outer sidewalls of the gate spacers 52. The dielectric liner 58 may be deposited by a conformal deposition method such as chemical vapor deposition (CVD) or atomic layer deposition (ALD). The thickness of the dielectric liner 58 can be in a range from 1 nm to 30 nm, although lesser and greater thicknesses can also be employed.

Figure 6:
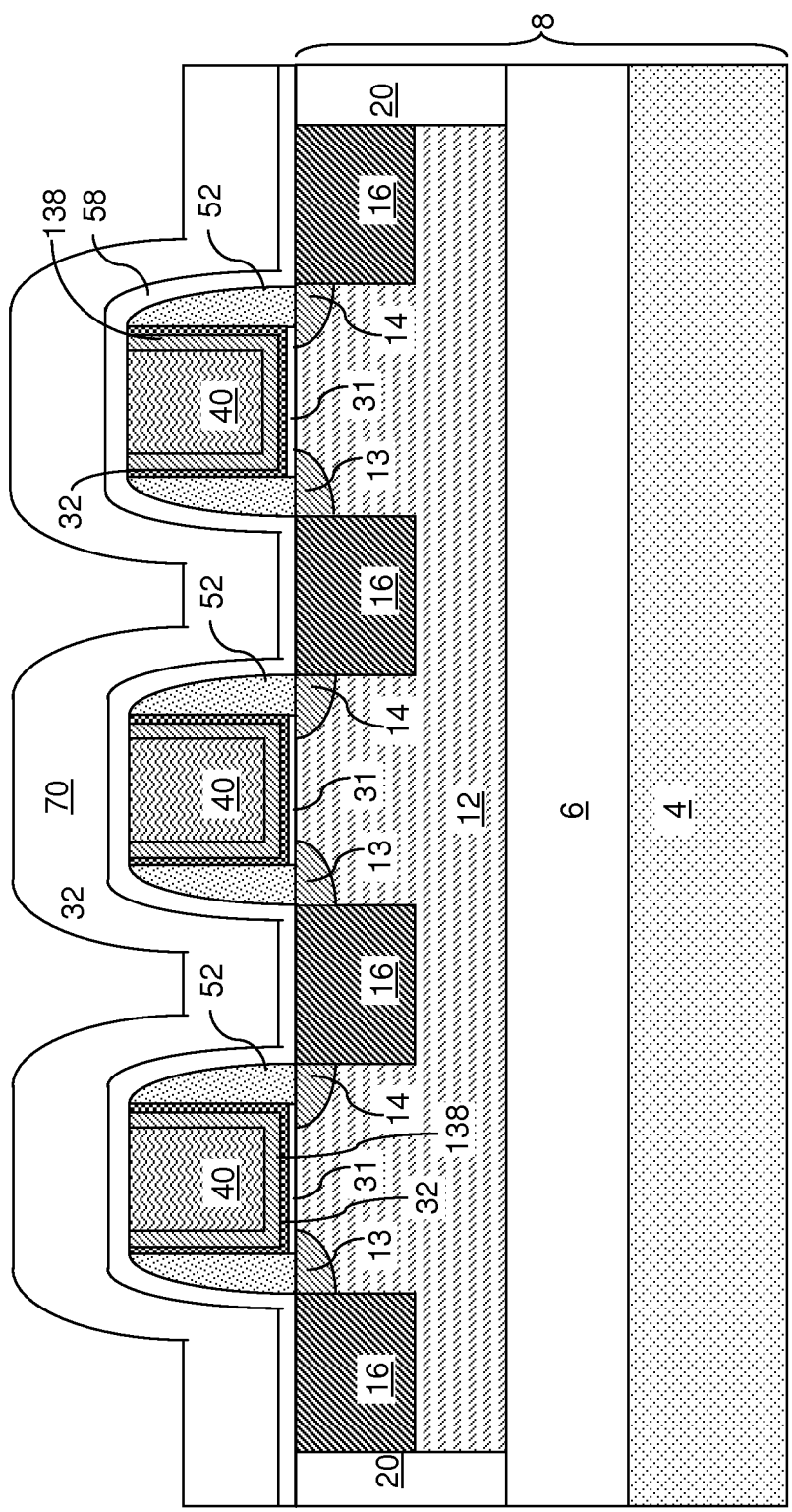
FIG. 6 is a vertical cross-sectional view of the first exemplary semiconductor structure after deposition of a first dielectric material layer according to an embodiment of the present invention.

Referring FIG. 6, a first dielectric material layer 70 including a first dielectric material can be deposited over the semiconductor material layer 12, the replacement gate structures (31, 32, 138, 40), and the optional dielectric liner 58. The first dielectric material is different from the dielectric material of the dielectric liner 58 if the dielectric liner 58 is present, and is different from the dielectric material of the gate spacers 52 if a dielectric liner is not present. In one embodiment, the dielectric liner 58 can include a dielectric metal oxide, and the first dielectric material can be silicon oxide or silicon nitride. In another embodiment, a dielectric liner may be absent, and the gate spacer 52 can include silicon nitride, and the first dielectric material can be silicon oxide.

The first dielectric material layer 70 can be formed by a non-conformal deposition method such as plasma enhanced chemical vapor deposition (PECVD) or high density plasma chemical vapor deposition (HDPCVD). Thus, the thickness of the deposited first dielectric material on horizontal surfaces is greater than the thickness of the deposited first dielectric material on vertical surfaces or substantially vertical surfaces. A horizontal top surface of the first dielectric material can be present between neighboring pairs of replacement gate structures (31, 32, 138, 40) below a horizontal plane including top surfaces of the replacement gate structures (31, 32, 138, 40).

Figure 7:
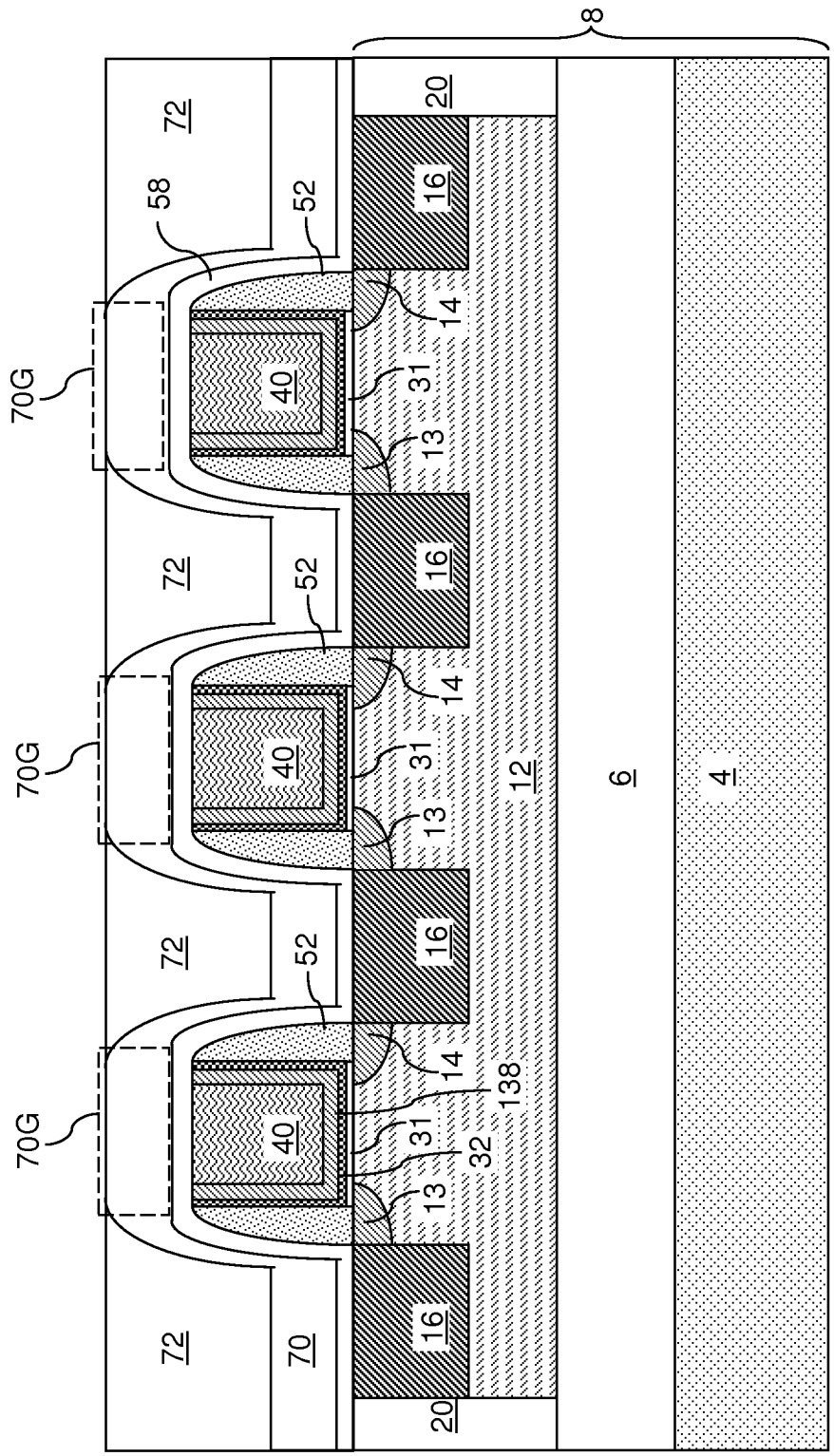
FIG. 7 is a vertical cross-sectional view of the first exemplary semiconductor structure after deposition and planarization of a second dielectric material layer according to an embodiment of the present invention.

Referring to FIG. 7, the first dielectric material layer 70 can be recessed isotropically by an isotropic etch. The isotropic etch can be a wet etch or a dry etch. In one embodiment, the recessing of the first dielectric material layer 70 can be performed such that the entirety of the first dielectric material layer 70 as recessed is contiguous. The first dielectric material layer 70 includes gate-overlying first dielectric material portions 70G that overlie the replacement gate structures (31, 32, 138, 40). The gate-overlying first dielectric material portions 70G refer to the portions of the first dielectric material layer 70 that overlie the replacement gate structures (31, 32, 138, 40). The thinnest portion of the first dielectric material layer 70 can have a thickness in a range from 1 nm to 30 nm, although lesser and greater thicknesses can also be employed.

A second dielectric material layer 72 including a second dielectric material can be deposited over the first dielectric material layer 70, and can be subsequently planarized, for example, by chemical mechanical planarization (CMP). The second dielectric material is different from the first dielectric material. For example, if the first dielectric material is silicon oxide, the second dielectric material can be silicon nitride or an organosilicate glass. If the first dielectric material is silicon oxide, the second dielectric material can be silicon nitride. The second dielectric material layer 72 can be planarized to provide a planar top surface that is coplanar with physically exposed top surface of the first dielectric material layer 70, which are physically exposed surfaces of the gate-overlying first dielectric material portions 70G. Remaining portions of the second dielectric material layer 72 laterally surround upper portions of the replacement gate structures (31, 32, 138, 40) and the gate-overlying first dielectric material portions 70G.

Figure 8:
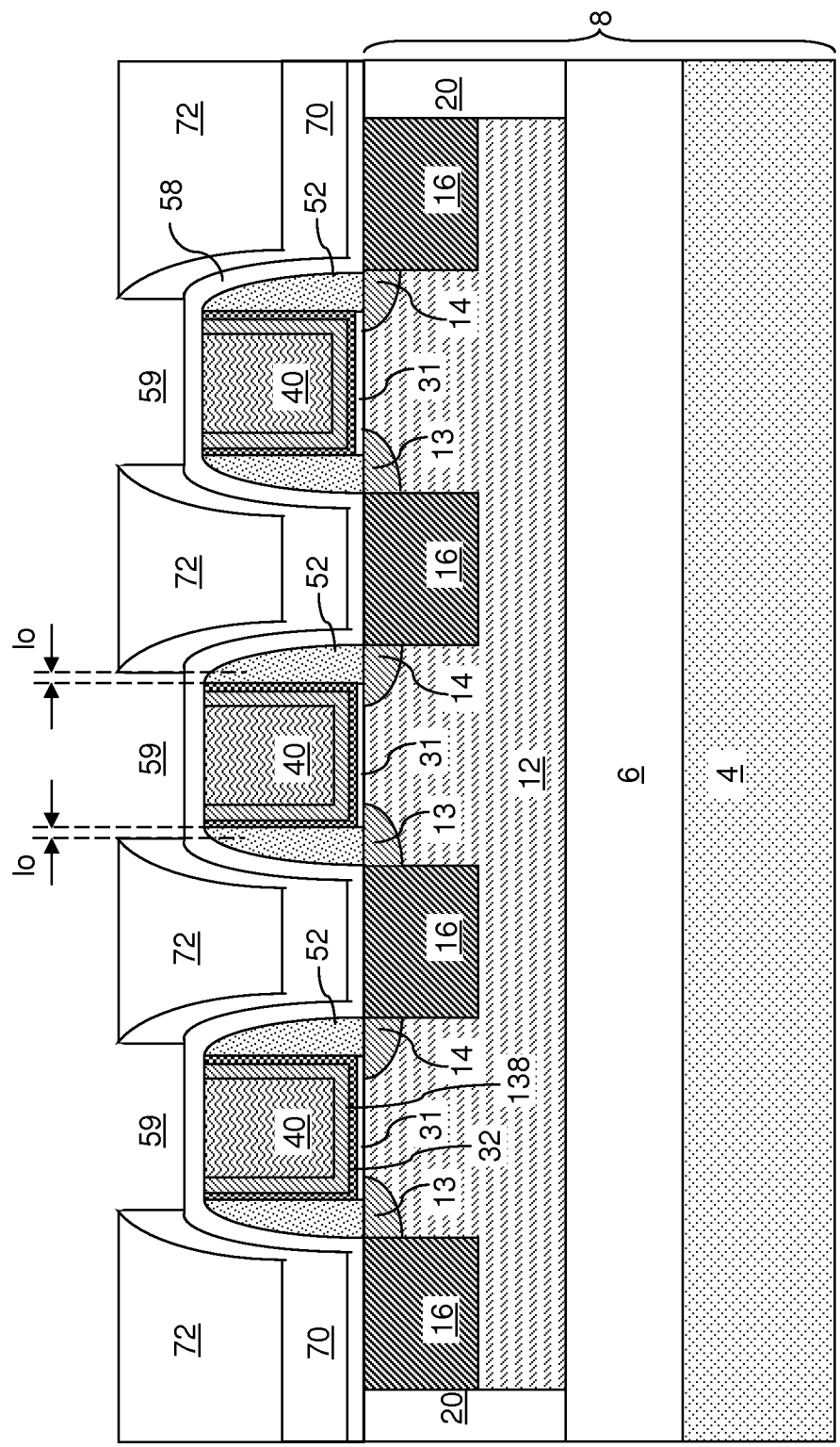
FIG. 8 is a vertical cross-sectional view of the first exemplary semiconductor structure after formation of cavities by selective removal of a first dielectric material with respect to a second dielectric material according to an embodiment of the present invention.

Referring to FIG. 8, cavities 59 can be formed by removing the first dielectric material selective to the second dielectric material by an anisotropic etch. Specifically, portions of the first dielectric material layer 70 that are not covered by the second dielectric material layer 72 are removed from above the replacement gate structures (31, 32, 138, 40) by an anisotropic etch employing the second dielectric material layer 72 as an etch mask. The cavities 59 are formed in regions from which the first dielectric material is removed. A top surface of the dielectric liner 58 (or a top surface of a replacement gate structure (31, 32, 138, 40) if a dielectric liner is not present) is physically exposed at the bottom of each cavity 59. The sidewalls of each cavity 59 can be substantially vertical. The area of each cavity 59 can be substantially the same as the area of the corresponding physically exposed surface of the first dielectric material layer 72 prior to performing the anisotropic etch.

In one embodiment, the sidewalls of a cavity 59 can be laterally offset outward from vertical planes including outer sidewalls of an underlying replacement gate structure (31, 32, 138, 40) by a same offset distance lo throughout an entire periphery of the replacement gate structure (31, 32, 138, 40). The lateral offset distance lo may be in a range from 1 nm to 30 nm, although lesser and greater lateral offset distances may also be employed.

Figure 9:
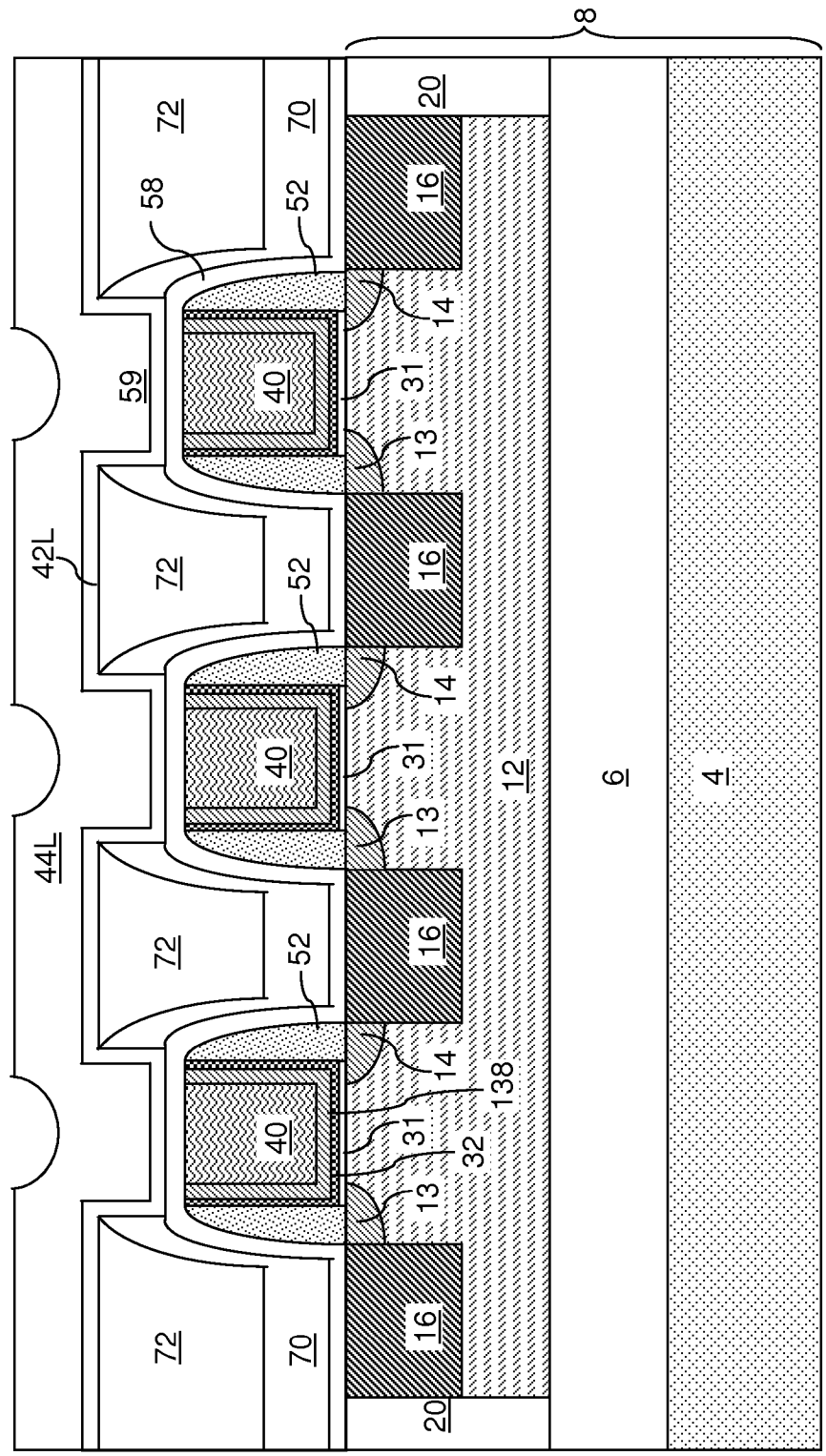
FIG. 9 is a vertical cross-sectional view of the first exemplary semiconductor structure after deposition of a third dielectric material layer and a fourth dielectric material layer according to an embodiment of the present invention.

Referring to FIG. 9, a third dielectric material layer 42L can be subsequently deposited in the cavities 59 and over the second dielectric layer 72. The third dielectric material layer 42L includes a third dielectric material that is different from the first dielectric material and the second dielectric material. In one embodiment, the third dielectric material can include a dielectric metal oxide having a dielectric constant greater than 3.9. In one embodiment, the third dielectric material layer 42L can include any material that can be employed for the gate dielectric 32. In one embodiment, the third dielectric material layer 42L can be formed, for example, by atomic layer deposition (ALD). The thickness of the third dielectric material layer 42L can be in a range from 3 nm to 60 nm, although lesser and greater thicknesses can also be employed. The third dielectric material layer 42L contacts the sidewalls of the first dielectric material layer 72.

A fourth dielectric material layer 44L including a fourth dielectric material can be deposited within the remaining volumes of the cavities 59. The fourth dielectric material can be, for example, silicon oxide or silicon nitride. The fourth dielectric material layer 44L can be deposited, for example, by chemical vapor deposition. All volumes of the cavities 59 below the top surface of the second dielectric material layer 72 are filled with the fourth dielectric material.

Figure 10:
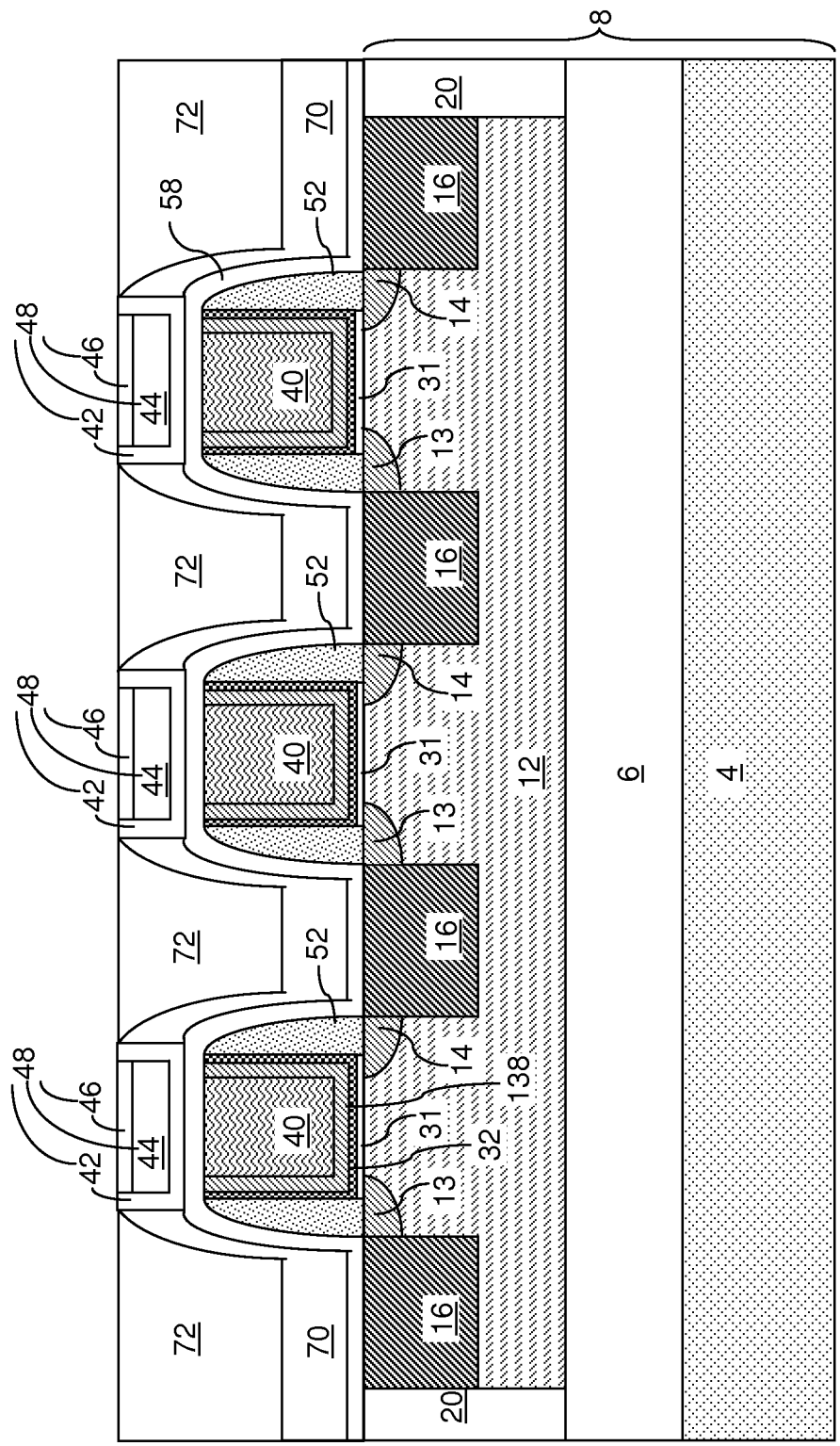
FIG. 10 is a vertical cross-sectional view of the first exemplary semiconductor structure after gate cap dielectric material portions according to an embodiment of the present invention.

Referring to FIG. 10, the fourth dielectric material layer 44L can be subsequently planarized, for example, by chemical mechanical planarization (CMP). Portions of the fourth dielectric material layer 44L are removed outside the area of each cavity 59 by planarization. A fourth dielectric material portion 44 is formed in each cavity by recessing a remaining portion of the fourth dielectric material layer 44L after the planarization.

In one embodiment, the portions of the third dielectric material layer 42L contacting the second dielectric material layer 72 can be employed as a stopping layer for the planarization process. Each remaining portion of the fourth dielectric material layer 44L is herein referred to as a fourth dielectric material portion 44. Each fourth dielectric material portion 44 overlies a replacement gate structure (31, 32, 138, 40). Each fourth dielectric material portion 44 can have a top surface that is coplanar with the top surface of the third dielectric material layer 42L. Top surfaces of the fourth dielectric material portions 44 are recessed relative to the top surface of the third dielectric material layer 42L and below a horizontal plane including the top surface of the second dielectric material layer 72.

Alternatively, the portions of the third dielectric material layer 42L can be removed from above the top surface of the second dielectric material layer 72. In this case, the remaining portions of the third dielectric material layer 42L constitute third dielectric material portions 42, which overlie the replacement gate structures (31, 32, 138, 40). Top surfaces of the fourth dielectric material portions 44 are recessed relative to the top surface of the third dielectric material portions 42 and below a horizontal plane including the top surface of the second dielectric material layer 72.

A fifth dielectric material layer can be subsequently deposited on the fourth dielectric material portions 44. The fifth dielectric material layer is deposited directly on the fourth dielectric material portions 44 and directly on the top surface of the third dielectric material layer 42L (if the third dielectric material layer 42L is present over the top surface of the second dielectric material layer 72) or directly on the top surface of the second dielectric material layer 72 (if the fourth dielectric material layer 44L is previously removed from above the top surface of the second dielectric material layer 72). The fifth dielectric material layer includes a dielectric material that is different from the dielectric material of the second dielectric material layer 72. In one embodiment, the fifth dielectric material layer can include a dielectric metal oxide having a dielectric constant greater than 3.9.

Portions of the fifth dielectric material layer and any remaining portion of the third dielectric material layer 44L can be removed from above the top surface of the second dielectric material layer 72. The portion of the fifth dielectric material layer above the top surface of the second semiconductor material layer 72 and any remaining portion of the third dielectric material layer 42L above the top surface of the second dielectric material layer 72 (unless the third dielectric material layer 42L is previously removed from above the top surface of the second dielectric material layer 72 to form third dielectric material portions 42) are removed, for example, by chemical mechanical planarization.

Remaining portions of the third, fourth, and fifth dielectric material layers constitute gate cap dielectric material portions 48. Each gate cap dielectric material portion 48 includes a third dielectric material portion 42 and a dielectric stack (44, 46) of a fourth dielectric material portion 44 and a fifth dielectric material portion 46. Each third dielectric material portion 42 is a remaining portion of the third dielectric material layer 42L. Each fourth dielectric material portion 44 is a remaining portion of the fourth dielectric material layer 44L. Each fifth dielectric material portion 46 is a remaining portion of the fifth dielectric material layer. Each gate cap dielectric material portion 48 includes at least the third dielectric material, which is different from the first and second dielectric materials. Each gate cap dielectric material portion 48 overlies a replacement gate structure (31, 32, 138, 40) and contacts sidewalls of the first dielectric material layer 70. Each dielectric stack (44, 46) is laterally surrounded by a third dielectric material portion 42.

Within each gate cap dielectric material portion 48, the third dielectric material portion 42 and the dielectric stack (44, 46) have a topmost surface that is coplanar with the top surface of the second dielectric material layer 72. Outer sidewalls of the gate cap dielectric material portion 48 are laterally offset outward from outer sidewalls of the underlying replacement gate structure (31, 32, 138, 40) by the same offset distance lo throughout an entire periphery of the replacement gate structure (31, 32, 138, 40).

Figure 11:
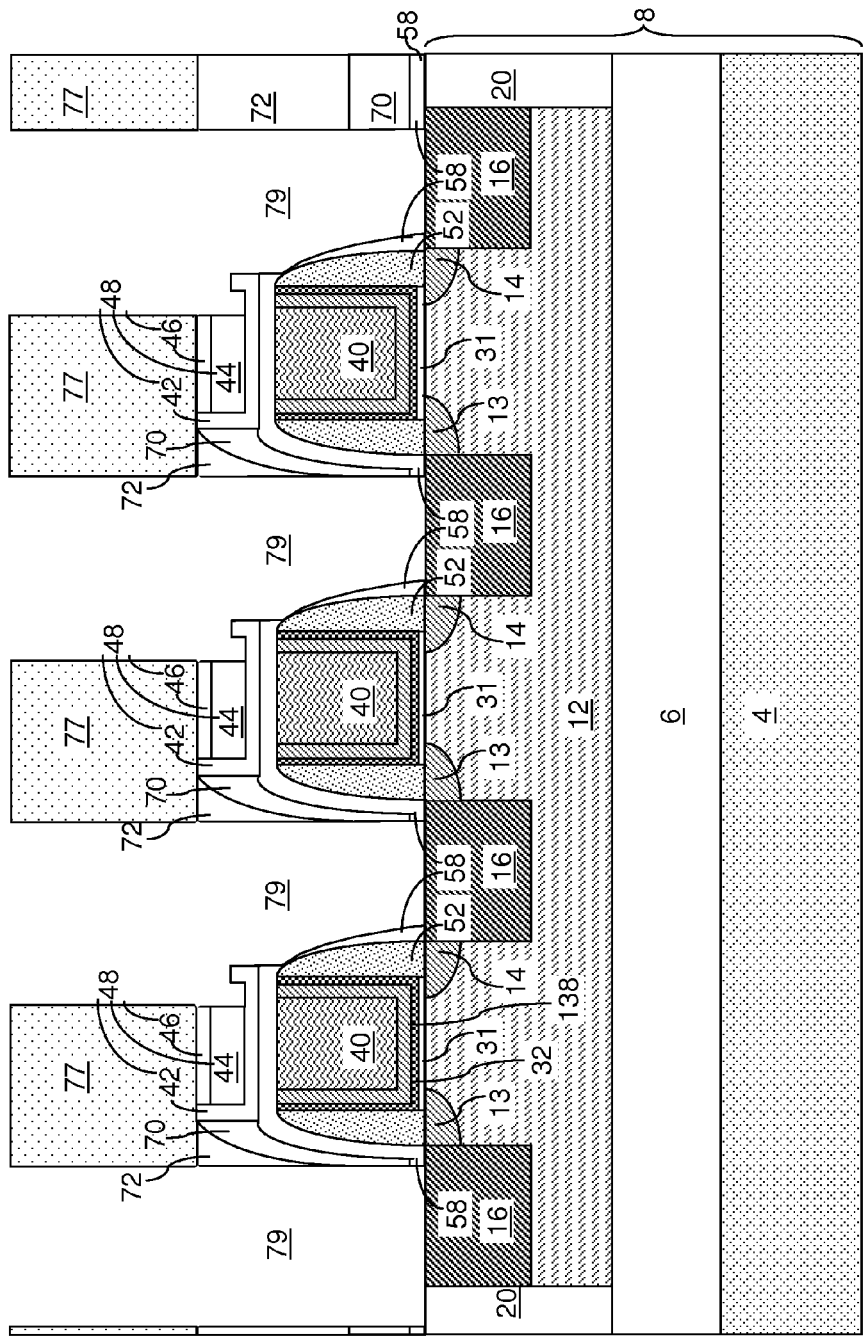
FIG. 11 is a vertical cross-sectional view of the first exemplary semiconductor structure after formation of contact via holes according to an embodiment of the present invention.

Referring to FIG. 11, a photoresist layer 77 is applied over the second dielectric material layer 72 and the gate cap dielectric material portions 48, and is lithographically patterned to form openings in areas in which contact via structures are to be subsequently formed. In one embodiment, the openings in the photoresist layer 77 can be formed in areas overlapping with the source/drain regions 16. The pattern in the photoresist layer 77 is transferred through the second dielectric material layer 72 and the first dielectric material layer 70 by an anisotropic etch that employs the photoresist layer 77 as an etch mask. Contact via holes 79 are formed through the second and first dielectric material layer (72, 70) employing an anisotropic etch that is selective to the third dielectric material.

In one embodiment, two different anisotropic etch steps may be employed to remove physically exposed portions of the second dielectric material layer 72 and the first dielectric material layer 70 within the areas of the openings in the photoresist layer 77. In one embodiment, the anisotropic etch can include a first anisotropic etch step that etches the second dielectric material selective to the third dielectric material, and a second anisotropic etch step that etches the first dielectric material selective to the third dielectric material. In one embodiment, the etch chemistry that etches the first dielectric material layer 70 can be selective to the dielectric material of the dielectric liner 58 (if the dielectric liner 58 is present) or selective to the gate spacer 52 (if a dielectric liner is not present). Any physically exposed portions of the dielectric liner 58 is subsequently etched by another anisotropic etch.

Overlay variations during lithographic alignment can cause one or more of the openings in the photoresist layer 77 to overlie a portion of the replacement gate electrode (41, 32, 138, 40). A peripheral portion of a gate cap dielectric material portion 48 can be recessed during the formation of the contact via holes 79. In this case, a contact via hole 79 can extend to a volume overlying the recessed peripheral portion of the gate cap dielectric material portion 48. At least the third dielectric material portion 42 within each partially etched gate cap dielectric material portion 48 is not etched through so that the top surface of an underlying replacement gate structure (31, 32, 138, 40) is vertically spaced from any overlying portion of the contact via hole 79 at least by the thickness of a horizontal portion of the dielectric liner 58 (if the dielectric liner 58 is present) or at least by the thickness of the remaining portion of the third dielectric material portion 42 (if a dielectric liner is not present).

Figure 12:
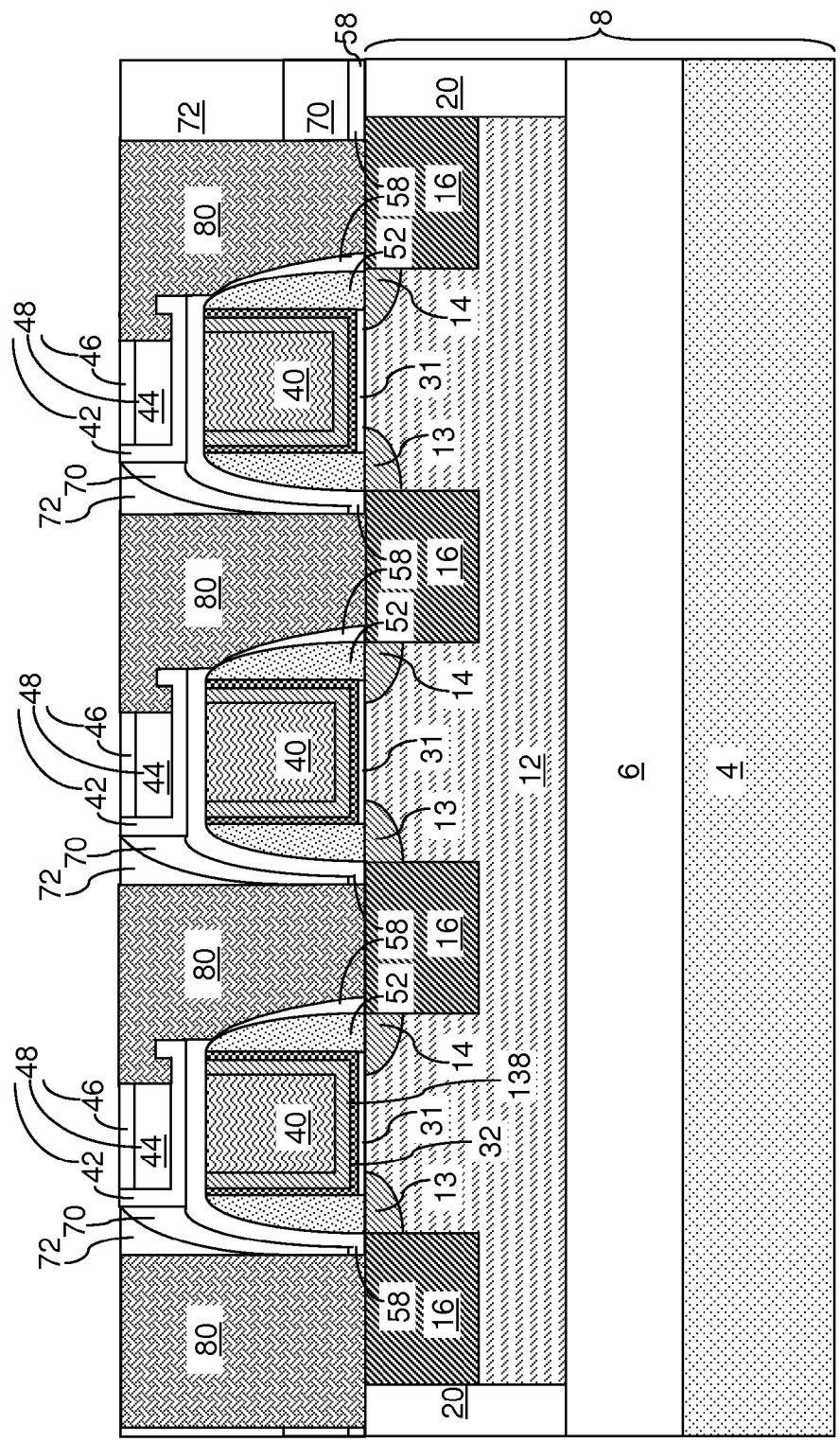
FIG. 12 is a vertical cross-sectional view of the first exemplary semiconductor structure after formation of various contact via structures according to an embodiment of the present invention.

Referring to FIG. 12, various contact via structures 80 can be formed within the contact via holes 79 by filling the contact via holes 79 with at least one conductive material and over the top surface of the second dielectric material layer 72, and by removing portions of the at least one conductive material from above the top surface of the second dielectric material layer 72. A contact via structure 80 extending through the second and first dielectric material layers (72, 70) is formed within each contact via hole 79. Each contact via structure 80 can provide electrical contact to an element in the semiconductor material layer 12, and can contact at least a sidewall of a gate cap dielectric material portion 48. In one embodiment, a contact via structure 80 can overlie a peripheral portion of the gate cap dielectric material portion 48. In one embodiment, the contact via structure 80 can contact a surface of the gate cap dielectric material portion 48 that is recesses relative the topmost horizontal surface of the gate cap dielectric material portion 48. In an illustrative example, the element in the semiconductor material layer 12 that contacts a contact via structure 80 can be a source/drain region 16, i.e., a source region or a drain region of a field effect transistor.

Figure 13:
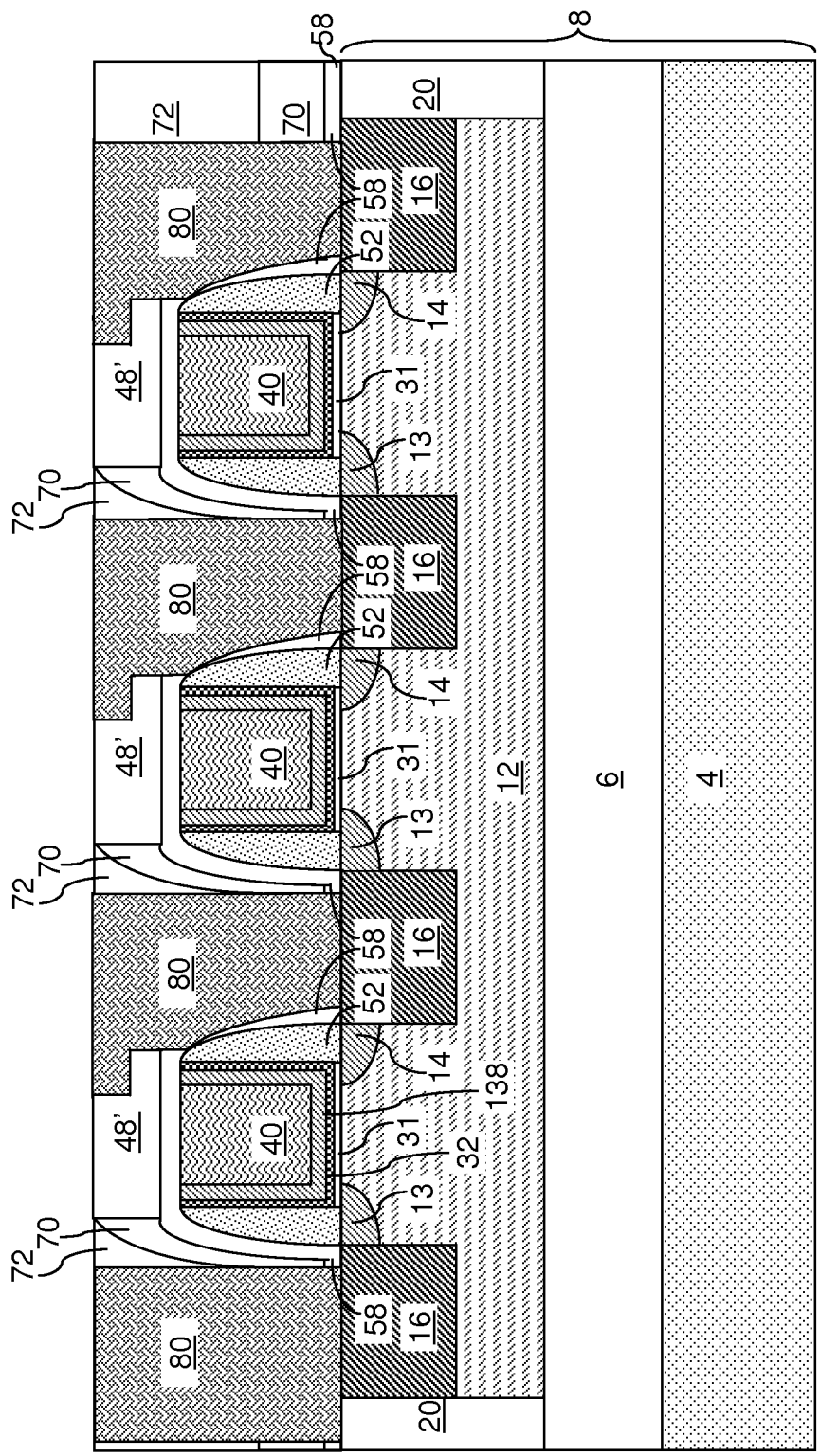
FIG. 13 is a vertical cross-sectional view of a variation of the first exemplary semiconductor structure after formation of various contact via structures according to an embodiment of the present invention.

Referring to FIG. 13, a variation of the first exemplary semiconductor structure can be derived from the first exemplary semiconductor structure of FIG. 8 by depositing a third dielectric material layer 42L (See FIG. 9) such that the third dielectric material layer 42L completely fills the volumes of the cavities 59. The third dielectric material layer 42L can have the same composition as described above. The portions of the third dielectric material layer 42L above the top surface of the second dielectric material layer 72 are subsequently removed, for example, by chemical mechanical planarization. The remaining portions of the third dielectric material layer 42L constitute gate cap dielectric material portions 48', which consists of the third dielectric material. Subsequently, the processing steps of FIGS. 11 and 12 can be performed.

Figure 14:
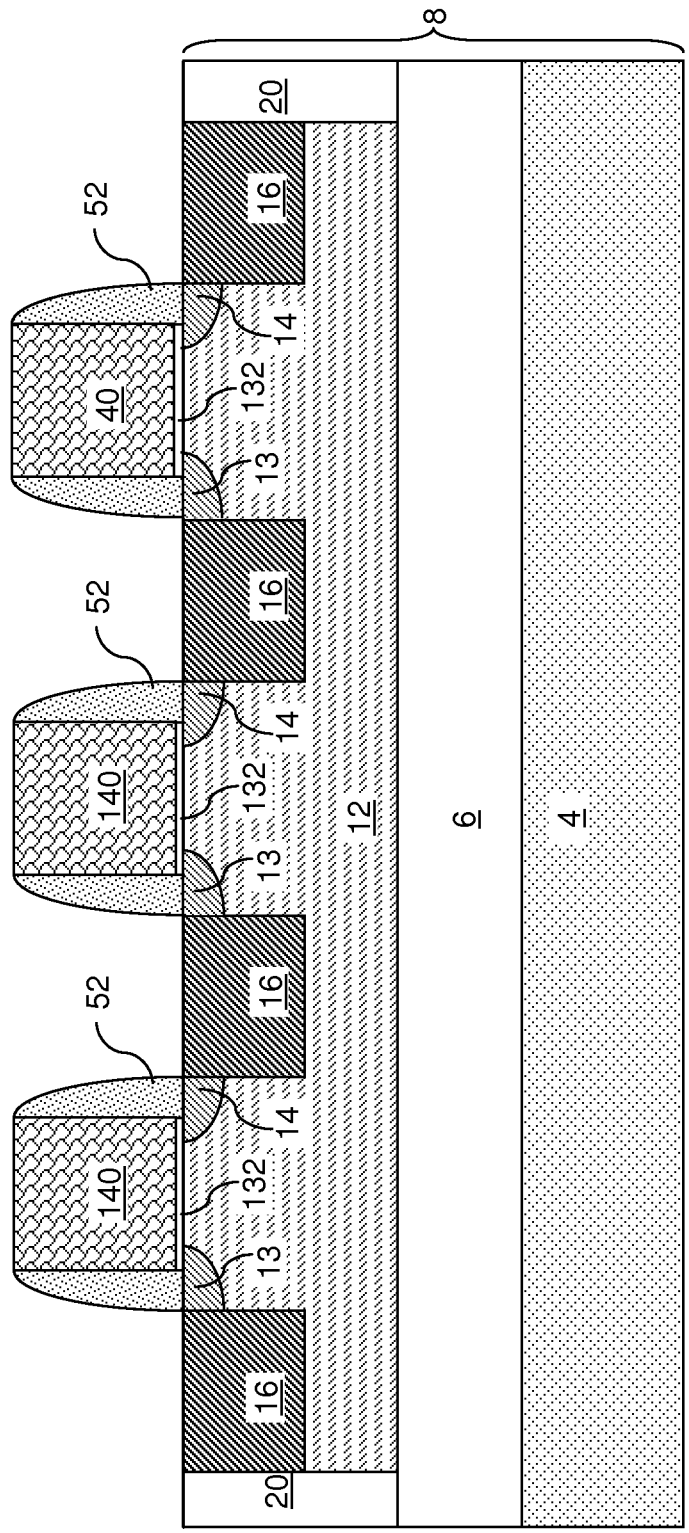
FIG. 14 is a vertical cross-sectional view of a second exemplary semiconductor structure after formation of permanent gate stacks according to an embodiment of the present invention.

Referring to FIG. 14, a second exemplary semiconductor structure according to an embodiment of the present invention can be provided by forming a permanent gate structure including a gate dielectric 132 and a gate electrode 140 in lieu of each disposable gate structure (23, 27, 29) illustrated in FIG. 1, and by omitting formation of a template dielectric layer 60.

Figure 15:
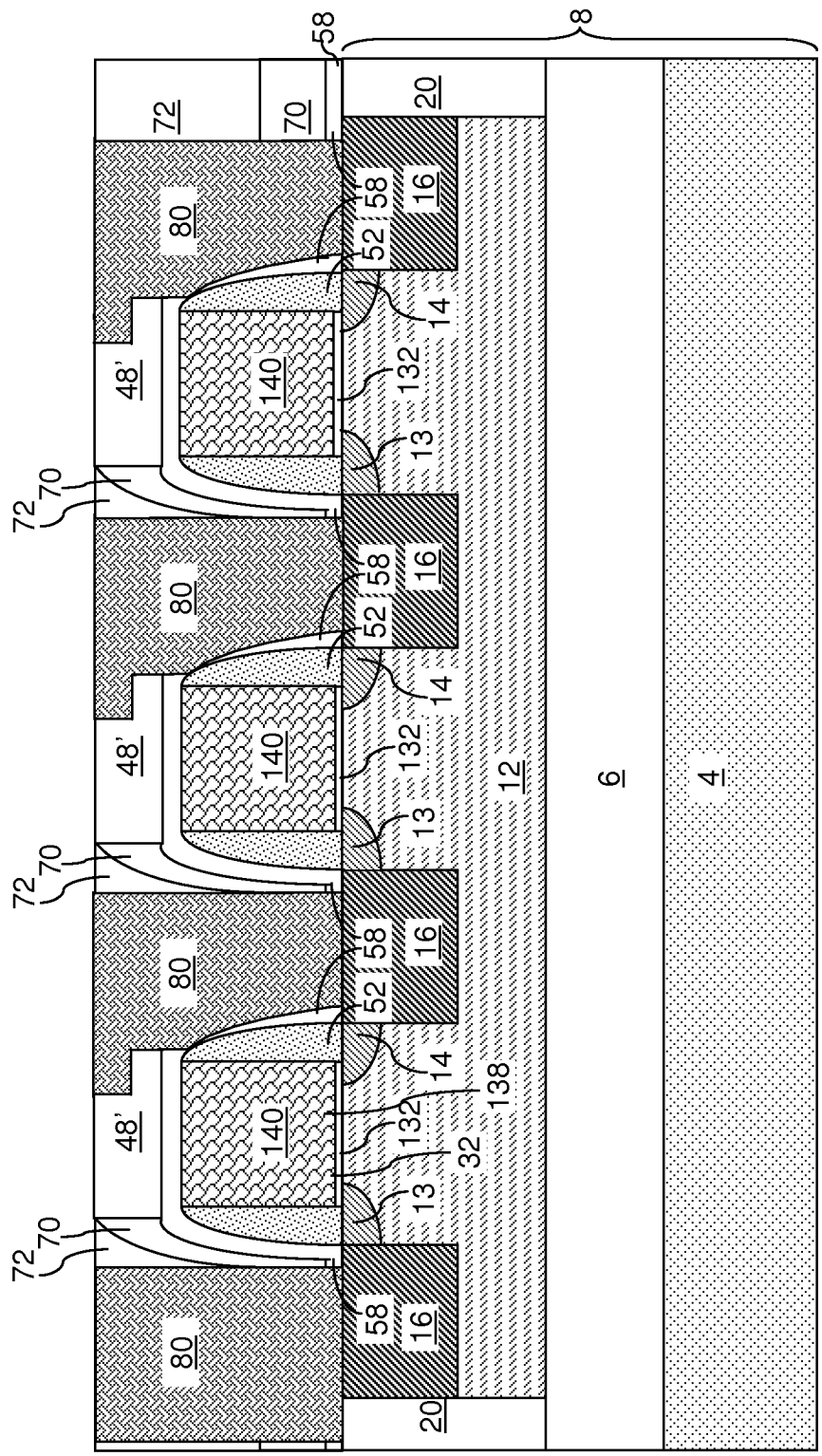
FIG. 15 is a vertical cross-sectional view of the second exemplary semiconductor structure after formation of various contact via structures according to an embodiment of the present invention.

The processing steps of FIGS. 5-12 can be performed to provide the second exemplary structure illustrated in FIG. 15. Optionally, processing steps for providing the variation illustrated in FIG. 13 can also be performed.

While the invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly disclosed otherwise or otherwise impossible as would be known to one of ordinary skill in the art. Accordingly, the invention is intended to encompass all such alternatives, modifications and variations which fall within the scope and spirit of the invention and the following claims.

What is claimed is:

1. A method of forming a semiconductor structure comprising:
   forming a gate structure including a stack of a gate dielectric and a gate electrode and over a portion of a semiconductor material layer;
   forming a first dielectric material layer comprising a first dielectric material over said semiconductor material layer and said gate structure;
   forming a second dielectric material layer comprising a second dielectric material that is different from said first dielectric material over said first dielectric material layer;
   planarizing said second dielectric material layer to provide a planar top surface, wherein a top surface of said first dielectric material layer is physically exposed over said gate structure;
   removing a portion of said first dielectric material layer from above said gate structure by an anisotropic etch employing said second dielectric material layer as an etch mask, wherein a cavity is formed over said gate structure;
   forming a gate cap dielectric material portion by filling said cavity with at least a third dielectric material that is different from said first and second dielectric materials, said third dielectric material contacting sidewalls of said first dielectric material layer; and
   forming a contact via hole through said second and first dielectric material layers employing another anisotropic etch that is selective to said third dielectric material.

2. The method of claim 1, wherein said another anisotropic etch comprises:
   a first anisotropic etch step that etches said second dielectric material selective to said third dielectric material; and
   a second anisotropic etch step that etches said first dielectric material selective to said third dielectric material.

3. The method of claim 2, further comprising forming a contact via structure by:
   depositing a conductive material within said contact via hole and over said second dielectric material layer; and
   removing portions of said conductive material from above a topmost surface of said second dielectric material layer.

4. The method of claim 1, further, comprising recessing a peripheral portion of said gate cap dielectric material portion during said forming of said contact via hole, wherein said contact via hole extends to a volume overlying said recessed peripheral portion of said gate cap dielectric material portion.

5. The method of claim 1, wherein outer sidewalls of said cavity are laterally offset outward from outer sidewalls of said gate structure by a same offset distance throughout an entire periphery of said gate structure.

6. The method of claim 1, wherein said third dielectric material comprises a dielectric metal oxide.

7. The method of claim 1, wherein said gate cap dielectric material portion is formed by:
   depositing a third dielectric material layer in said cavity and over said second dielectric material layer;
   depositing a fourth dielectric material layer over said third dielectric material layer;
   removing portions of said fourth dielectric material layer outside an area of said cavity by planarization;
   forming a fourth dielectric material portion in said cavity by recessing a remaining portion of said fourth dielectric material layer after said planarization;
   depositing a fifth dielectric material layer on said fourth dielectric material portion; and
   removing portions of said fifth dielectric material layer and said third dielectric material layer from above a top surface of said second dielectric material layer, wherein said gate cap dielectric portion comprises remaining portions of said third and fifth dielectric material layers and said fourth dielectric material portion.

8. The method of claim 1, further comprising forming a dielectric liner over said semiconductor material layer and said gate structure prior to forming said first dielectric material layer.

9. The method of claim 8, further comprising forming a gate spacer comprising a dielectric material around said gate structure prior to forming said dielectric liner.

10. A method of forming a semiconductor structure comprising:
    forming a gate structure including a stack of a gate dielectric and a gate electrode and over a portion of a semiconductor material layer;
    forming a first dielectric material layer comprising a first dielectric material over said semiconductor material layer and said gate structure;

forming a second dielectric material layer comprising a second dielectric material that is different from said first dielectric material over said first dielectric material layer;

planarizing said second dielectric material layer to provide a planar top surface, wherein a top surface of said first dielectric material layer is physically exposed over said gate structure;

removing a portion of said first dielectric material layer from above said gate structure by an anisotropic etch employing said second dielectric material layer as an etch mask, wherein a cavity is formed over said gate structure; and forming a gate cap dielectric material portion by filling said cavity with at least a third dielectric material that is different from said first and second dielectric materials, said third dielectric material contacting sidewalls of said first dielectric material layer, wherein said gate cap dielectric material portion is formed by:

depositing a third dielectric material layer in said cavity and over said second dielectric material layer;

depositing a fourth dielectric material layer over said third dielectric material layer;

removing portions of said fourth dielectric material layer outside an area of said cavity by planarization;

forming a fourth dielectric material portion in said cavity by recessing a remaining portion of said fourth dielectric material layer after said planarization;

depositing a fifth dielectric material layer on said fourth dielectric material portion; and removing portions of said fifth dielectric material layer and said third dielectric material layer from above a top surface of said second dielectric material layer, wherein said gate cap dielectric portion comprises remaining portions of said third and fifth dielectric material layers and said fourth dielectric material portion.

11. The method of claim 10, further comprising forming a contact via hole through said second and first dielectric material layers employing another anisotropic etch that is selective to said third dielectric material.

12. The method of claim 11, wherein said another anisotropic etch comprises:
a first anisotropic etch step that etches said second dielectric material selective to said third dielectric material; and
a second anisotropic etch step that etches said first dielectric material selective to said third dielectric material.

13. The method of claim 12, further comprising forming a contact via structure by:
depositing a conductive material within said contact via hole and over said second dielectric material layer; and
removing portions of said conductive material from above a topmost surface of said second dielectric material layer.

14. The method of claim 11, further comprising recessing a peripheral portion of said gate cap dielectric material portion during said forming of said contact via hole, wherein said contact via hole extends to a volume overlying said recessed peripheral portion of said gate cap dielectric material portion.

15. The method of claim 10, wherein outer sidewalls of said cavity are laterally offset outward from outer sidewalls of said gate structure by a same offset distance throughout an entire periphery of said gate structure.

16. The method of claim 10, wherein said third dielectric material comprises a dielectric metal oxide.

17. The method of claim 10, further comprising forming a dielectric liner over said semiconductor material layer and said gate structure prior to forming said first dielectric material layer.

18. The method of claim 17, further comprising forming a gate spacer comprising a dielectric material around said gate structure prior to forming said dielectric liner.

\* \* \* \* \*